(12) United States Patent  (10) Patent No.: US 8,709,906 B2
Engelhardt et al.  (45) Date of Patent: Apr. 29, 2014

(54) MIM CAPACITOR AND ASSOCIATED PRODUCTION METHOD

(75) Inventors: Manfred Engelhardt, Feldkirchen-Westerham (DE); Andreas Stich, Gruenwald (DE); Guenther Schindler, Munich (DE); Michael Schrenk, Diessen am Ammersee (DE)

(73) Assignee: Infineon Technologies AG, Neubiberg (DE)

( * ) Notice: Subject to any disclaimer, the term of this patent is extended or adjusted under 35 U.S.C. 154(b) by 18 days.

(21) Appl. No.: 13/342,120

(22) Filed: Jan. 2, 2012

(65) Prior Publication Data

US 2012/0100689 A1 Apr. 26, 2012

Related U.S. Application Data

(62) Division of application No. 11/540,502, filed on Sep. 29, 2006, now Pat. No. 8,093,637.

(30) Foreign Application Priority Data

Sep. 30, 2005 (DE) .......................... 10 2005 047 111

(51) Int. Cl.
 *H01L 21/20* (2006.01)
(52) U.S. Cl.
 USPC .................... 438/396; 257/E21.011; 257/296
(58) Field of Classification Search
 USPC .......... 438/171, 190, 243, 250, 396; 257/296, 257/E21.011
 See application file for complete search history.

(56) References Cited

U.S. PATENT DOCUMENTS

| 6,255,187 | B1 | 7/2001 | Horii |
| 6,759,703 | B1 | 7/2004 | Matsuhashi |
| 7,189,615 | B2 | 3/2007 | Rao et al. |
| 2003/0001190 | A1 | 1/2003 | Basceri et al. |
| 2003/0011043 | A1 | 1/2003 | Roberts |
| 2003/0027385 | A1* | 2/2003 | Park et al. ............... 438/253 |
| 2004/0149991 | A1 | 8/2004 | Won |
| 2004/0224474 | A1 | 11/2004 | Barth et al. |
| 2004/0256654 | A1 | 12/2004 | Korner et al. |
| 2005/0067701 | A1 | 3/2005 | Coolbaugh et al. |
| 2005/0116277 | A1* | 6/2005 | Schrenk ................... 257/306 |
| 2005/0121744 | A1 | 6/2005 | Chang et al. |
| 2005/0205933 | A1* | 9/2005 | Sinha ....................... 257/347 |
| 2005/0212082 | A1 | 9/2005 | Takeda et al. |
| 2006/0046378 | A1 | 3/2006 | Choi et al. |

FOREIGN PATENT DOCUMENTS

| JP | 2005-142337 | * | 6/2005 |
| JP | 2005142337 | | 6/2005 |
| JP | 200619379 | | 1/2006 |

OTHER PUBLICATIONS

English Abstract of JP2006-19379 (Jan. 19, 2006).
English Abstract of JP2005-142337 (Jun. 2, 2005).
N. Petrov et al., Electrochemical Study of the Electroless Deposition of Co(P) and Co(W, P) Alloys, Journal of the Electrochemical Society, 149, pp. 187-194, (Feb. 19, 2002).

* cited by examiner

*Primary Examiner* — Tony Tran

(57) ABSTRACT

An MIM capacitor includes a first capacitor electrode, which is formed in the surface of a first intermediate dielectric, a second intermediate dielectric, which is formed on the first intermediate dielectric and has an opening that exposes the first capacitor electrode, and a first electrically conducting diffusion barrier layer, which is formed on the surface of the exposed first capacitor electrode. On the diffusion barrier layer and on the side walls of the opening there is also formed a capacitor dielectric and a second capacitor electrode on top.

7 Claims, 5 Drawing Sheets

MIM CAPACITOR AND ASSOCIATED PRODUCTION METHOD

PRIORITY CLAIM

This is a divisional application of application Ser. No. 11/540,502, filed Sep. 29, 2006, which claims the benefit of priority of German Patent Application No. DE 10 2005 047 111.0, filed Sep. 30, 2005, all of which are incorporated by reference in their entirety herein.

BACKGROUND

1. Technical Field

The present invention relates to a metal-insulator-metal (MIM) capacitor and to an associated production method, and in particular to an MIM capacitor suitable for a dual damascene process.

2. Background Information

Capacitors are required in a large number of applications, such as for example, electronic filters, analog-to-digital converters, control circuits and in particular in analog circuits. In semiconductor technology, in which a large number of different functions are integrated on a single chip, so-called metal-insulator-metal (MIM) caps or MIM capacitors are therefore increasingly being used. Such an MIM capacitor is a special type of capacitor in which two metal plates are formed parallel to the surface of a semiconductor wafer and are separated only by a capacitor dielectric.

However, the production of conventional MIM capacitors is very complex, since sometimes up to three lithographic steps are required to produce them. Furthermore, conventional MIM capacitors often have a very high leakage current and an undesirably high extrinsic defect density, which is caused by the influence of the Cu electrodes that are usually used.

US patent publication US 2004/0224474 A1 discloses an MIM capacitor and an associated production method according to the prior art in which a first capacitor electrode is formed in a first intermediate dielectric, subsequently an electrically conducting diffusion barrier layer is selectively formed on the surface of the capacitor electrode, furthermore a second intermediate dielectric is formed and an opening is etched in it to expose a partial region of the diffusion barrier layer. Then, a so-called "high-k" capacitor dielectric is deposited over the entire surface area and first a Cu seed layer and then a Cu filler material on top are introduced on its surface to fill the opening. After a planarizing step, the Cu introduced is closed off by a further diffusion barrier layer, and a further intermediate dielectric can be formed for subsequent interconnect levels.

Although in the case of such an MIM capacitor a greatly reduced leakage current is already obtained along with a reduced extrinsic defect density, the method is cost-intensive and considerable problems arise, in particular for subsequent process steps. In particular, it is not possible in the case of the conventional MIM capacitors for a low-cost dual-damascene process to be carried out to form further interconnects and contacting assemblies without additional process steps.

BRIEF SUMMARY

The disclosure is therefore based on the object of providing an MIM capacitor and an associated production method in which the costs are greatly reduced while virtually unchanged electrical properties are maintained. The production costs can be greatly reduced in particular by the use of a second capacitor electrode, which exclusively comprises an electrically conducting diffusion barrier layer, since it is possible for the first time also to use low-cost standard dual damascene processes for subsequent interconnect levels without additional process steps. The electrical properties that are obtained in particular from a reduced extrinsic defect density and a low leakage current are also sufficiently high.

In particular if the second capacitor electrode has a layer thickness which is greater than a layer thickness of a first electrically conducting diffusion barrier layer and less than half the layer thickness of the second intermediate dielectric, adequate electrical conductivity is obtained for the second capacitor electrode. For further improvement of this conductivity, a multiplicity of contact vias may contact the second capacitor electrode, as a result of which the pertaining process sequence for contact vias can be used to improve an electrical conductivity of the MIM capacitor.

Furthermore, a further electrically insulating diffusion barrier layer may be formed between the first intermediate dielectric and the second intermediate dielectric, as a result of which subsequent use of a dual damascene process can be greatly simplified. In particular when a further electrically insulating diffusion barrier layer is used on the surface of the second capacitor electrode, a simultaneous formation of contact vias for the MIM capacitor and for interconnects can be produced very easily in the first intermediate dielectric by a conventional dual damascene process.

Other systems, methods, features and advantages of the invention will be, or will become, apparent to one with skill in the art upon examination of the following figures and detailed description. It is intended that all such additional systems, methods, features and advantages be included within this description, be within the scope of the invention, and be protected by the following claims.

BRIEF DESCRIPTION OF THE DRAWINGS

The invention is described in more detail below on the basis of exemplary embodiments with reference to the drawings, in which.

DETAILED DESCRIPTION

FIGS. 1A to 1G show sectional views to represent the main method steps in the production of an MIM capacitor according to a first exemplary embodiment. The layer levels that are represented to be located in any desired metallization level of an integrated circuit.

Figure 1A:
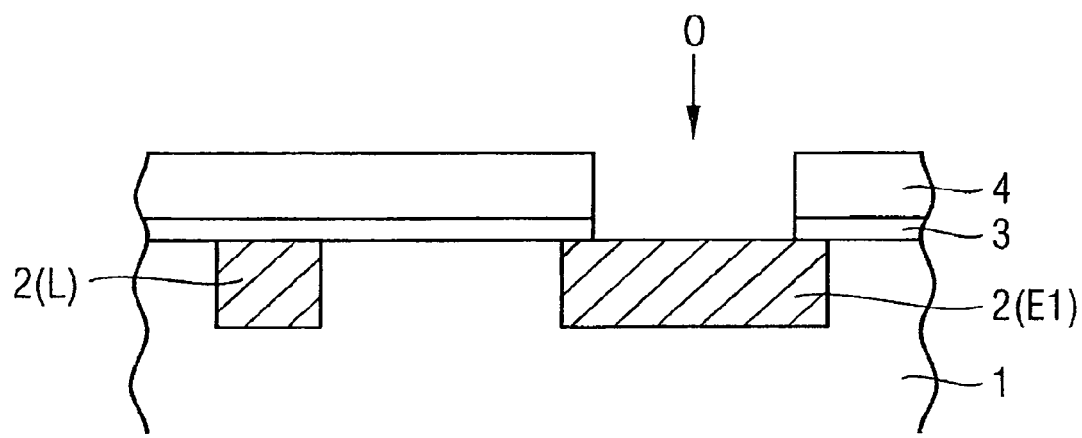
FIGS. 1A to 1G show sectional views to illustrate steps that produce an MIM capacitor.

According to FIG. 1A, first a first capacitor electrode E1 is formed in the planar surface of a first intermediate dielectric 1. The first intermediate dielectric 1 may be located here directly on the surface of the semiconductor wafer or be formed in an interconnect level lying over it. Furthermore, alternative carrier substrates may also be used in place of the semiconductor wafer.

A low-k material is used for example as the material for the intermediate dielectric, the dielectric constant of $SiO_2$ being considered as a reference value (k=3.9). Materials with a dielectric constant below 3.9 are therefore usually referred to as so-called "low-k" materials. Materials with higher dielectric constants are referred to as so-called "high-k" materials.

Conventional oxides such as silane oxide or TEOS may also be used for the intermediate dielectric. The formation of the first capacitor electrode E1 and an interconnect L, likewise located in the intermediate dielectric, may be formed for example by a single or dual damascene process in the first intermediate dielectric 1, a metallic filling layer 2 being deposited in trenches previously formed in the intermediate dielectric 1. The filling layer 2 usually has a diffusion barrier layer (not represented) on the side walls and the bottom of the trenches. A TaN/Ta diffusion barrier layer structure and Cu are usually used for this metallic filling layer 2.

An optional first electrically insulating diffusion barrier layer 3 may be formed on the planarized surface of the first intermediate dielectric or the interconnect L and the first capacitor electrode E1 formed therein. This diffusion barrier layer 3, also referred to as the covering layer, is deposited, for example, by a chemical vapor deposition process (CVD), and may comprise $Si_3N_4$, SiC, SiCN or a so-called low-k material.

According to FIG. 1A, furthermore, a second intermediate dielectric 4 is formed, preferably over the full surface area, either on the optional first electrically insulating diffusion bather layer 3 or directly on the first intermediate dielectric 1. Like the first intermediate dielectric, this second intermediate dielectric preferably consists of a low-k material or a silane oxide or TEOS. However, a thickness of this second dielectric layer is significantly less than the intermediate dielectrics that are usually deposited in such a production step and in particular is less than 2-3 F, where F is a minimum structure width that can be produced photolithographic processes of a respective production process or a respective technology.

Next, the surface area of the MIM capacitor is determined by a conventional lithographic step and is subsequently etched. An opening 0 is formed in the second intermediate dielectric 4 and the optionally present first electrically insulating diffusion barrier layer 3 to expose at least part of the first capacitor electrode E1. For example, plasma etching processes or reactive ion etching (RIE) may be carried out here. The surface area of the opening 0 substantially thereby determines the capacitance of the MIM capacitor.

Figure 1B:
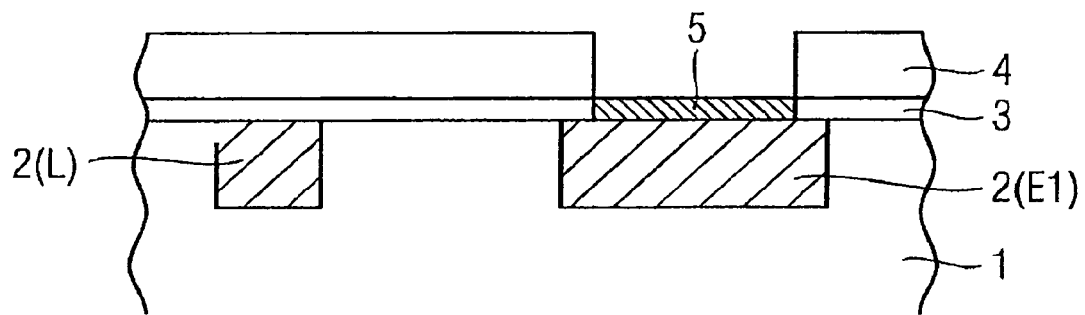

According to FIG. 1B, in a subsequent step a first electrically conducting diffusion barrier layer 5 is formed in a self-adjusting manner on the first capacitor electrode E1. An electrically conducting diffusion barrier layer 5 is selectively formed on the surface of the first capacitor electrode E1 exposed by the opening 0, an electroless depositing process preferably being carried out in a wet-chemical bath. Such depositing processes are described for example in the publication by N. Petrov et al.: "Electrochemical study of the electroless deposition of Co (P) and Co (WP) Alloys", Journal of the Electrochemical Society, 149, pages 187 to 194, Feb. 19, 2002.

By alternative processes, subsequent materials may also be grown in a self-adjusted and selective manner on copper: nickel-tungsten-phosphorus, nickel-tungsten-boron, nickel-tungsten-phosphorus-boron, nickel-rhenium-phosphorus, nickel-rhenium-boron, nickel-rhenium-phosphorus-boron, nickel-molybdenum-phosphorus, nickel-molybdenum-boron, nickel-molybdenum-phosphorus-boron, nickel-phosphorus, cobalt-tungsten-boron, cobalt-tungsten-phosphorus, cobalt-tungsten-phosphorus-boron, cobalt-rhenium-phosphorus, cobalt-rhenium-boron and cobalt-rhenium-phosphorus-boron.

This electrically conducting barrier layer 5 prevents diffusion of the metal of the capacitor electrode E1 into other layers, and in particular into a semiconductor material or substrate (not represented), and also provides a good interface between the capacitor electrode and the capacitor dielectric of the MIM capacitor. In particular, a very homogeneous thickness of the capacitor dielectric can be set as a result, since an extrinsic defect density is significantly reduced. The thickness of this selectively formed and consequently self-adjusted diffusion barrier layer 5 is about 10 to 100 nm and is dependent on the technology that is respectively used.

Figure 1C:
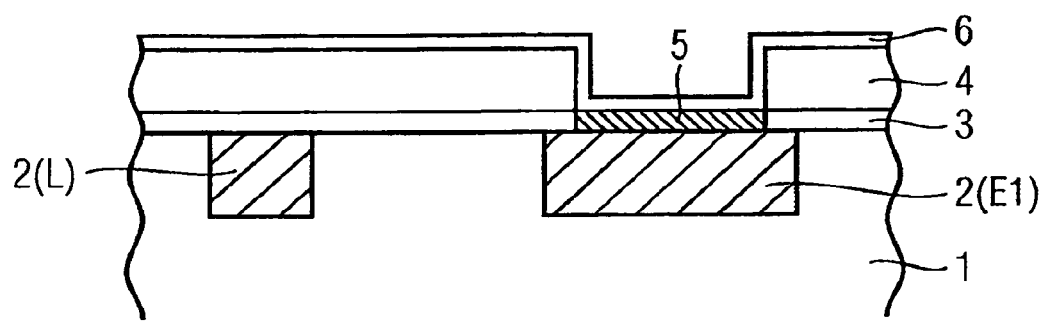

According to FIG. 1C, this bather layer 5 is followed by formation of a capacitor dielectric 6 over the full surface area on the surface of the first electrically conducting diffusion bather layer 5 and the second intermediate dielectric 4. A high-k dielectric is deposited with a thickness that is as small as possible of from 2 to 50 nm by a CVD or Atomic Layer Deposition (ALD) process at a temperature that is as low as possible. A typical thickness, which lies in particular in the region of the capacitor electrode or the diffusion barrier layer 5 formed on top of it, is about 10 nm. This capacitor dielectric 6 thereby covers in the same way the side walls of the opening 0 and a main surface of the second intermediate dielectric 4.

As materials for the capacitor dielectric 6, $Si_3N_4$, $Al_2O_3$, $HfO_2$, $ZrO_2$ or oxide-nitride-oxide (ONO) layer sequences for example may be deposited in a conformal manner, i.e. with the same layer thickness. The layer for the capacitor dielectric 6 that is drawn up on the side walls of the opening 0 has the effect of producing extended leakage current paths LS, which in turn reduce a leakage current of the MIM capacitance. The height of the second intermediate dielectric 4 or its thickness has the effect of influencing the length of the leakage current path, and consequently also the leakage current, from the first capacitor electrode E1 or the diffusion barrier layer 5 to the second capacitor electrode E2.

According to FIG. 1D, conformal formation of a second electrically conducting diffusion barrier layer 7 over the full surface area is subsequently carried out on the surface of the capacitor dielectric 6 as the second capacitor electrode E2. This second electrically conducting diffusion barrier layer 7 has a layer thickness which is significantly thicker than the first electrically conducting diffusion barrier layer 5, although it should not be greater than the remaining depth of the opening 0. It is preferably less than half the layer thickness of the second intermediate dielectric 4, adequate space for a third intermediate dielectric 9 still being available subsequently.

An electrically conducting second diffusion barrier layer 7 at least 10 nm thick, the thickness of which however is not greater than the thickness of the second intermediate dielectric 4, and is consequently less than 2-3F, may be formed by a CVD, ALD or physical vapor deposition (PVD) process. As materials for the second electrically conducting diffusion barrier layer 7, Ta, Ti, TaN and/or TIN for example may be deposited.

Figure 1D:
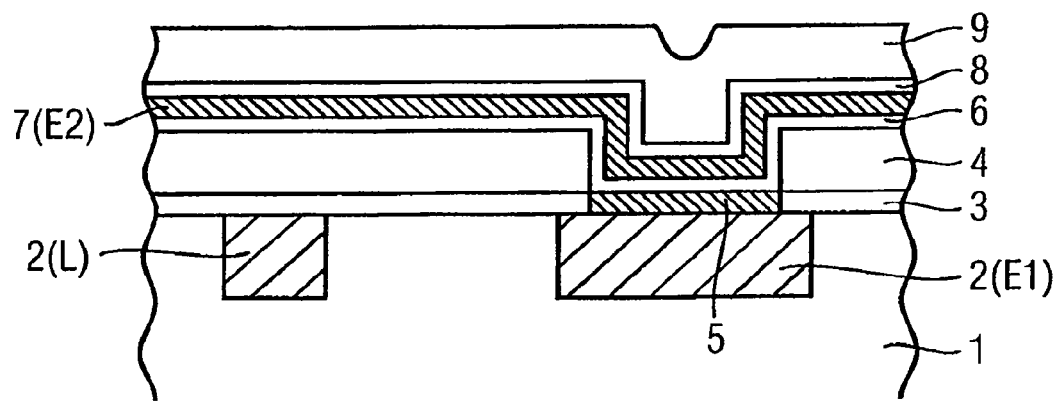

According to FIG. 1D, a second electrically insulating diffusion barrier layer 8 may also be formed as an etch stop layer on the surface of the second capacitor electrode E2, comprising only the second electrically conducting diffusion barrier layer 7, the same material as for the first electrically insulating diffusion bather layer 3 preferably being used. Use of these preferably identical optional diffusion barrier layers 3 and 8 makes it possible, in particular during contacting that is subsequently to be carried out, for an identical process to be carried out both for the MIM capacitor and for the interconnect L. As a result of which the production costs are in turn significantly reduced. Like the first electrically insulating diffusion barrier layer 3, the layer 8 accordingly also preferably consists of $Si_3N_4$, SiC, SiCN or a low-k material.

Furthermore, according to FIG. 1D, a third intermediate dielectric 9 is applied to the second capacitor electrode E2 or, if present, to the second electrically insulating diffusion barrier layer 8, a thickness being chosen such that the opening 0 is now 30 completely filled. The third intermediate dielectric 9 may also consist of a low-k material or an oxide (silane, TEOS).

Figure 1E:
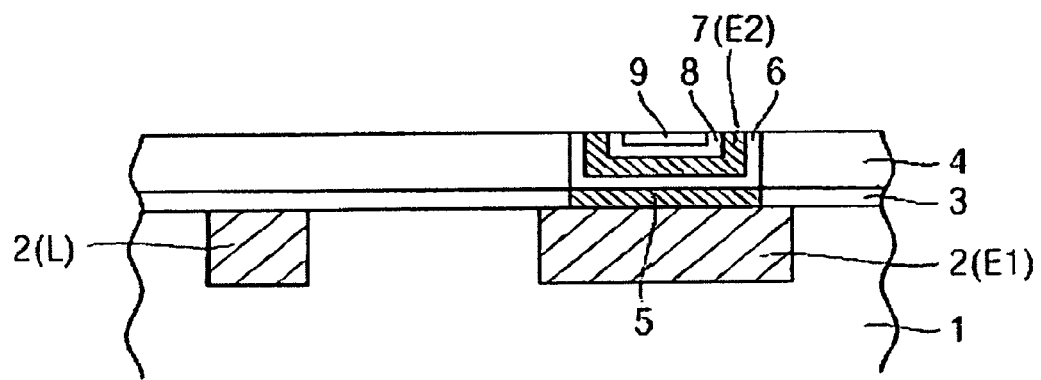

According to FIG. 1E, planarizing is subsequently carried out (for patterning at least the capacitor dielectric and the second capacitor electrode), preferably by means of a Chemical Mechanical Polishing (CMP), the planarizing only being stopped when the second intermediate dielectric 4 is reached. Therefore, a number of CMP steps are necessary in order to remove the third intermediate dielectric 9, the second electrically insulating diffusion barrier layer 8, the second capacitor electrode E2 and the capacitor dielectric 6 of the MIM capacitor.

Figure 1F:
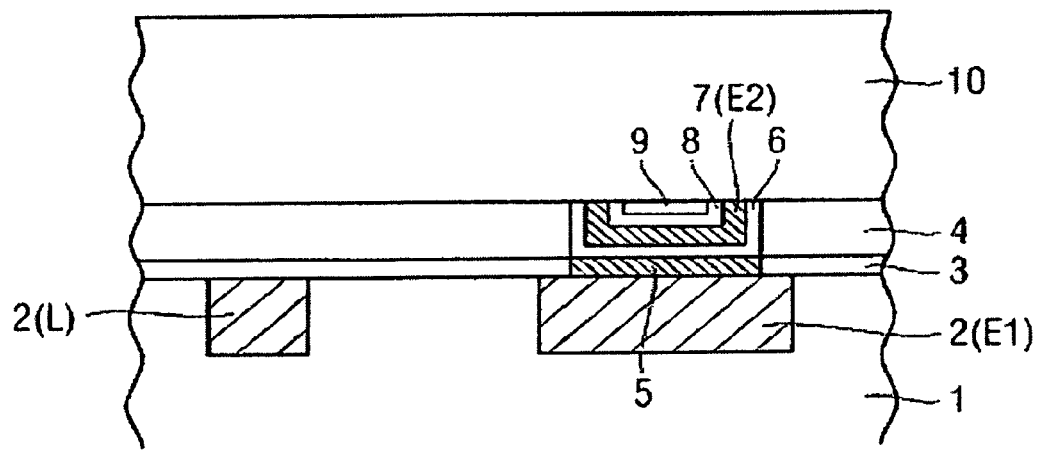

According to FIG. 1F, a further intermediate dielectric 10 is then formed over the interconnects L or the MIM capacitor for the contact vias or, in the case of the dual damascene process, for the contact vias and further interconnects. The further intermediate dielectric 10 is deposited on the planarized surface according to FIG. 1E, which dielectric has, in particular for a preferred dual damascene process, a multiplicity of dielectric layers for the contact vias and trenches or interconnects that are to be formed.

Subsequently, the contact holes KL and the associated contact vias can be etched by conventional lithography for connecting the interconnect L and the second capacitor electrode E2.

Figure 1G:
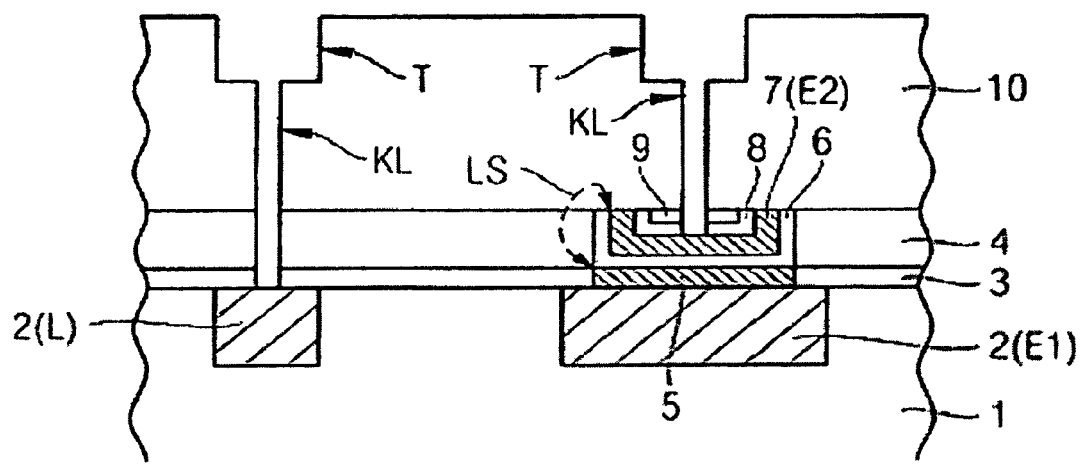

According to FIG. 1G, a dual damascene process is preferably carried out, a trench T for respective further interconnects first being etched and then a contact hole KL for the contacting of the interconnect L or the second capacitor electrode E2 lying thereunder. Since the second capacitor electrode E2 can then be directly contacted for the first time, and consequently it is possible to dispense with additional protective layers, as are required for example for Cu, significant cost savings are obtained. In particular, conventional dual damascene processes can be carried out both for the contacting of the interconnects L and for the contacting of the second capacitor electrode E2. If the optional electrically insulating diffusion barrier layers 3 and 8, which preferably comprise the same materials, are used, the production method can be additionally further simplified, since the same etching processes can then be used for both contact pads.

Because the second capacitor electrode E2 now exclusively comprises an electrically conducting diffusion bather layer with a higher layer thickness, a higher internal resistance is obtained by contrast with MIM capacitors that use Cu for example as capacitor electrodes.

Figure 2:
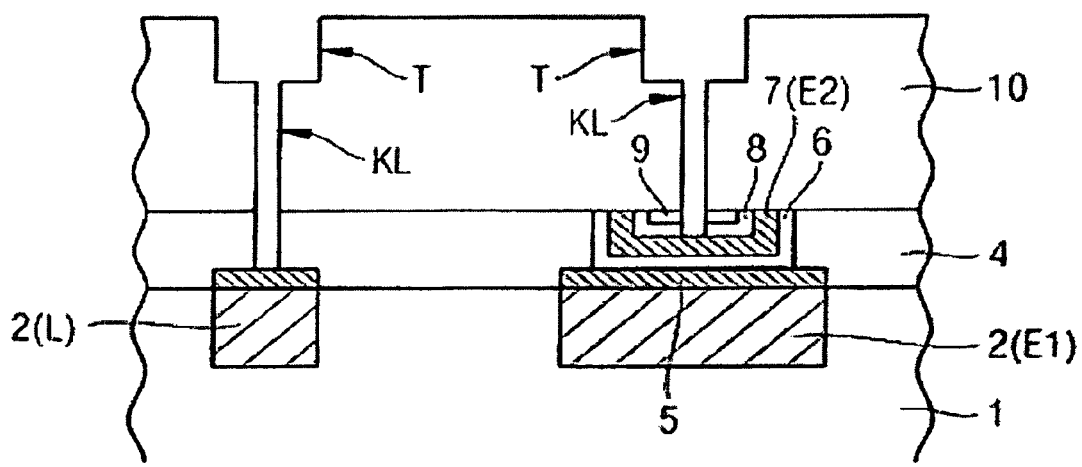
FIG. 2 shows a sectional view of an MIM capacitor.

FIG. 2 shows a sectional view of an MIM capacitor according to a second exemplary embodiment, the same designations denoting the same or corresponding elements as in FIG. 1, for which reason their description is not repeated in the following text.

According to this second exemplary embodiment, it is also possible to dispense with the optional first electrically insulating diffusion barrier layer 3 and to carry out the selective depositing process for forming the self-adjusted electrically conducting diffusion barrier layer 5 before the formation of the second intermediate dielectric 4. As a consequence, according to FIG. 2, not just the exposed region but the entire region of the first capacitor electrode E1 and also the exposed surface of the interconnect L are coated with the first electrically conducting diffusion barrier layer 5, and subsequently the second intermediate dielectric 4 (and optionally the first electrically insulating diffusion barrier layer 3) is/are deposited. The further method steps correspond to the method steps according to the first exemplary embodiment, for which reason their description is not repeated in the following text.

Figure 3:
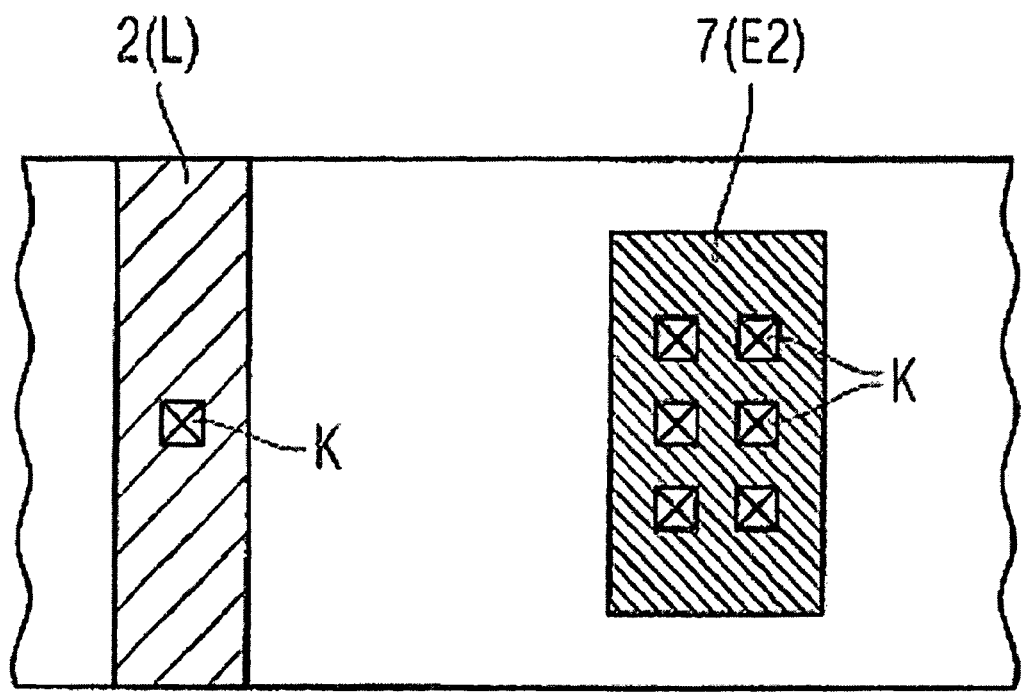
FIG. 3 shows a plan view to represent a contacting assembly.

FIG. 3 shows a plan view that represents a contacting assembly according to the first or second exemplary embodiment, the same references denoting the same or corresponding elements as in FIG. 1 or 2, for which reason their description is not repeated in the following text. According to FIG. 3, an increased internal resistance for the second capacitor electrode E2 can be at least partly compensated by a changed contacting assembly, a multiplicity of contact vias K being formed in the region of the second capacitor electrode E2 for contacting the second capacitor electrode E2 in the further intermediate dielectric 10. To reduce the production costs further, these contact vias K are identical to the contact vias K for the interconnects L, for which reason an increase in the number of contact vias K is directly proportional to an increase in the contact area for the second capacitor electrode E2, and consequently improves the internal resistance of the second capacitor electrode E2. In this way, an MIM capacitor and an associated production method with greatly reduced production costs are obtained, while maintaining virtually unchanged electrical properties (leakage current, extrinsic defect density).

It is therefore intended that the foregoing detailed description be regarded as illustrative rather than limiting, and that it be understood that it is the following claims, including all equivalents, that are intended to define the spirit and scope of this invention.

The invention claimed is:

1. A method for producing an MIM capacitor with the steps of:
   forming a first capacitor electrode in the planar surface of a first intermediate dielectric;
   forming a second intermediate dielectric on the first intermediate dielectric and the first capacitor electrode;
   forming an opening in the second intermediate dielectric for exposing at least part of the first capacitor electrode, the opening having sidewalls:
   selectively forming a first electrically conducting diffusion barrier layer within the opening, on the surface of the exposed first capacitor electrode, after forming the opening in the second intermediate dielectric layer, such that the sidewalls of the opening is at least partially free of the first electrically conducting diffusion barrier layer;
   forming a capacitor dielectric over the full surface area on the surface of the first electrically conducting diffusion barrier layer and the second intermediate dielectric and at least partially in direct contact with the sidewalls of the opening;
   forming a second electrically conducting diffusion barrier layer over the full surface area on the surface of the capacitor dielectric as the second capacitor electrode;
   forming a third intermediate dielectric over the full surface area on the second capacitor electrode;
   performing a planarization down to the second intermediate dielectric;
   forming a further intermediate dielectric on the planarized surface; and
   forming a multiplicity of contact vias in the further intermediate dielectric, the multiplicity of contact vias contacting the second capacitor electrode;
   wherein, in forming the second electrically conducting diffusion barrier layer, forming the second capacitor electrode with a layer thickness which is greater than the layer thickness of the first diffusion barrier layer and less than half the layer thickness of the second intermediate dielectric;

further comprising:

wherein before forming the second intermediate dielectric, forming a first electrically insulating diffusion barrier layer on the surface of the first intermediate dielectric and the first capacitor electrode; and wherein, in forming the opening, forming the opening in the first electrically insulating diffusion barrier layer.

2. The method as claimed in patent claim 1, wherein, in selectively forming the first electrically conducting diffusion barrier layer, performing an electroless depositing process in a wet-chemical bath.

3. The method as claimed in patent claim 1, wherein, in forming the capacitor dielectric, depsositing a high-k dielectric with a thickness of from 2 to 50 nm as the capacitor dielectric.

4. The method as claimed in patent claim 1, wherein, in forming the second electrically conducting diffusion barrier layer, depositing at least one of Ta, Ti, TaN and TiN.

5. The method as claimed in patent claim 1, wherein, before forming the third intermediate dielectric, forming a second electrically insulating diffusion barrier layer on the surface of the second capacitor electrode.

6. The method as claimed in patent claim 1, wherein, in performing the planarization, performing a CMP process.

7. The method as claimed in patent claim 1, wherein an interconnect is also formed in the planarized surface of the first intermediate dielectric; and, wherein, in forming a multiplicity of contact vias, forming contact vias for contacting the interconnect at the same time as the multiplicity of contact vias in the further intermediate dielectric for contacting the second capacitor electrode.

* * * * *